United States Patent [19]

Caule

[11] 3,833,433

[45] Sept. 3, 1974

[54] METHOD OF PRODUCING TARNISH RESISTANT COPPER AND COPPER ALLOYS AND PRODUCTS THEREOF

[75] Inventor: Elmer J. Caule, New Haven, Conn.

[73] Assignee: Olin Corporation, New Haven, Conn.

[22] Filed: June 14, 1973

[21] Appl. No.: 369,904

[52] U.S. Cl. .......................... 156/3, 156/8, 156/308, 96/36.2, 148/6.16, 148/6.15 R

[51] Int. Cl. .......................................... H05k 3/06

[58] Field of Search ......... 156/3, 306, 308; 96/36.2; 148/6.16, 6.15 R, 6.2; 161/165, 225, 214

[56] References Cited

UNITED STATES PATENTS

| | | | |
|---|---|---|---|
| 3,677,828 | 7/1972 | Caule | 148/6.15 R |
| 3,716,427 | 2/1973 | Caule | 156/3 |

*Primary Examiner*—Ralph S. Kendall
*Attorney, Agent, or Firm*—Robert H. Bachman

[57] ABSTRACT

The disclosure teaches providing copper or a copper alloy, applying a phosphoric acid - dichromate solution to said material, immersing said material in an aqueous solution containing an alkali metal phosphate in a concentration of at least 18 percent by weight, and rinsing said material.

15 Claims, No Drawings

METHOD OF PRODUCING TARNISH RESISTANT COPPER AND COPPER ALLOYS AND PRODUCTS THEREOF

BACKGROUND OF THE INVENTION

The present invention relates specifically to metal plastic laminates having high bond strength and improved resistance to acid undercutting during manufacture of laminates into flexible printed circuits.

The present invention further broadly relates to treating copper and copper alloys to form a tarnish and oxidation resistant film thereon.

In the manufacture of flexible printed circuits, copper foil or sheet is employed which normally has applied to its surface a film of an inhibitor, such as benzotriazole, in order to prolong the shelf life before manufacture of the circuit.

Flexible printed circuits comprise copper sheets or copper foil bonded to the surface of a plastic sheet, such as a polyester or polyimide. Normally two types of copper foil, either wrought or electrodeposited, are employed in the manufacture of flexible printed circuits. Further it is advantageous to utilize wrought and annealed copper foil.

Printed circuits find wide use in the electrical and electronic fields since they are advantageous in the elimination of individual lead wires which require a separate soldering or other joining operation to the various components of any particular circuit. The configuration of such a circuit facilitates the positioning of conventional circuit components such as capacitors, etc., and the soldering of these components to the wiring by a dipping operation.

The manufacture of flexible printed circuits comprises adhesively bonding or laminating copper sheet or foil to a plastic film, such as a polyester or polyimide, and generally employing a suitable glue. As one preferred way the copper side of the resultant laminate is then sprayed with a photoresist and the required circuit is projected onto the resist-coated side of the copper component which transforms the photoresist into an acid insoluble compound in a figure and likeness of the circuit. The laminate is then immersed or sprayed with an acid etchant, such as a ferric chloride solution, to dissolve away the unwanted portion of the copper, i.e., that portion of the copper component of the laminate which is not part of the required circuitry.

Various problems arise however in the present manufacture of flexible printed circuits to which the present invention is directed.

For example, in order to provide tarnish resistance of rolled copper and an acceptable laminated product, before laminating a film of an organic inhibitor is normally applied to the surface of the copper.

The organic inhibitor, e.g., benzotriazole, provides for long shelf life or stability during storage.

Before laminating of a wrought hard copper to the plastic film it is advantageous to anneal the copper in order to provide increased ductility which is highly desirable in flexible printed circuits. It has been found that the organic inhibitor upon the copper surface decomposes during the annealing. Due to this decomposition problems arise, such as the effect of the benzotriazole is no longer apparent and therefore the product no longer has good shelf life and tarnishing occurs. The tarnishing causes both poor laminate bond strength, uneven acid etching, and rapid acid undercutting along the bonded interface during etching away of the unwanted copper portion of the laminate. The acid undercutting generally occurs at a rate equivalent to at least 30 mils per hour from each side of the copper circuitry, at the aforementioned interface, and materially degrades the quality of the printed circuit.

Therefore, unless treated the copper foil-plastic laminate exhibits poor bond strength when room temperature oxidation or tarnishing occurs on the foil. Furthermore, the resistance to acid undercutting along the interface of the wrought annealed foil is poor as aforementioned. A further complication with wrought annealed and other foil arises with the use of organic inhibitors, such as benzotriazole, since residual benzotriazole on the unbonded side of the foil results in uneven etching of the circuit because the benzotriazole provides some inhibition in the etching solution. A still further disadvantage with organic inhibitors occurs with certain plastic systems wherein high temperatures, i.e., above 240° F, are employed for curing of the glue. These high temperatures cause the copper-organic inhibiting film to decompose with the formation of relatively large amounts of gases which causes blistering of the laminate and thereby producing an unacceptable product.

It is well known, as aforementioned, that copper and many of its alloys possess low resistance to tarnishing in many atmospheres and particularly atmospheres containing industrial wastes, such as compounds of sulfur. It is therefore required, in order to provide a measure of tarnish resistance for a relatively prolonged period of time, that a film of an organic inhibitor, such as benzotriazole, be applied to the surface of the copper or copper alloy.

The application of such inhibitors provides for prolonging the aesthetic appeal of copper materials in finished form, such as lamp bases and other consumer goods for the home, and also provides for long shelf life before further manufacture of such materials into final consumer articles. This is particularly important since prolonged exposure of copper materials in an industrial environment naturally degrades the exposed surfaces resulting in build up of corrosion products, such as copper oxides and sulfides, which may necessitate a severe mechanical or chemical cleaning operation in order to restore the material surfaces to a condition compatible for normal further cleaning and manufacturing operations, e.g., a simple alkaline clean or degreasing cycle before additional mechanical working or soldering of the material.

It is therefore a principal object of the present invention to provide a method for producing increased tarnish resistance of copper and its alloys, and the article produced thereby.

It is an additional object of the present invention to provide a method for producing a copper, or copper alloy sheet or foil adhesively laminated to a plastic film to form a laminate wherein the laminate is characterized by increased resistance to acid undercutting and uneven dissolution of the unwanted copper during manufacture of the laminate into a flexible circuit, and the article produced thereby.

It is a further object to provide a method for producing a flexible printed circuit which is characterized by no substantial undercutting of the circuitry and by high bond or peel strength and tarnish resistance without degradation of other properties so desirable in flexible printed circuitry, and the article produced thereby.

It is still a further object of the present invention to provide the objects as aforesaid conveniently, expeditiously and inexpensively.

Further objects and advantages of the present invention will become apparent hereinafter.

SUMMARY OF THE INVENTION

In accordance with the present invention, the foregoing objects and advantages may be readily achieved. The present invention comprises: providing a material selected from the group consisting of copper and copper alloys; applying to said material a phosphoric acid solution of at least 8 percent concentration and containing from 3.5 grams per liter up to the solubility limit of a material selected from the group consisting of sodium dichromate and potassium dichromate and mixtures thereof, for at least 2 seconds; rinsing said material in water; immersing said material for at least 2 seconds in an aqueous solution containing a alkali metal phosphate in a concentration of at least 18 percent by weight, said solution being maintained at a temperature of at least 80° C and at a pH in the range of 2 to 4; and rinsing said material in water.

The present invention also provides for further adhesively bonding or laminating the treated copper or copper alloy to a plastic film to form a laminate and for further forming of the laminate into a flexible printed circuit. A preferred method of forming of the flexible printed circuit is by applying a photoresist to the surface of the aforementioned foil or sheet opposing the surface bonded to the plastic film, projecting the desired circuitry upon the photoresist to form an acid insoluble compound in the area of the required circuitry, dissolving away the unwanted copper in an acidic solution and then rinsing and drying.

The process of the present invention is characterized by the attainment of several highly significant advantages.

It is a particular advantage of the present invention that the treated wrought copper foil or sheet can be annealed prior to the aforementioned adhesively bonding step, which provides the advantage of high ductility of a wrought-annealed copper foil or sheet product.

It is to be noted that the present invention also broadly relates to highly tarnish resistant copper or an alloy thereof which possesses long shelf life, better solderability shelf life, and therefore materially reduces requisite cleaning of a fully manufactured and treated copper article as well as copper or copper alloy which requires further manufacturing or processing into finished articles, such as laminates and flexible printed circuits.

A particular advantage of the process of the present invention is the high bond strength of the laminates which are formed when said laminate is subjected to accelerated thermal aging tests. Frequently, laminate bond strengths decay when subjected to accelerated thermal aging tests. The material prepared in accordance with the present invention is resistant to decay upon accelerated aging tests, while still achieving the significant advantages of the process of the present invention.

DETAILED DESCRIPTION

Applicant's U.S. Pat. No. 3,716,427 teaches the basic process of applying a phosphoric acid solution of at least 8 percent concentration to copper or copper alloys, said solution containing from 3.5 grams per liter up to the solubility limit of a material selected from the group consisting of sodium dichromate and potassium dichromate and mixtures thereof. The process described in Applicant's prior application is characterized by the attainment of significant advantages. Thus, the process of said prior application provides for highly tarnish resistant copper or copper alloys which may be advantageously adhesively bonded to a plastic film, as, for example, in the form of flexible printed circuit. The printed circuit prepared in accordance with said prior application is characterized by a stable high bond strength and substantially no acid undercutting of the copper circuitry in the bonded interface.

It has been found that when said laminated material is subjected to accelerated thermal aging tests, the bond strength will frequently decay. This is naturally a significant problem.

In accordance with the process of the present invention, it has been found that this problem can be overcome by subsequently immersing the treated copper into a solution which is concentrated in phosphate and maintained at a specified pH range, as will be described hereinbelow.

In accordance with the process of the present invention, any suitable copper or alloy thereof may be employed. For example, it is particularly preferred to utilize copper or copper alloys which can conveniently carry the required current for a printed circuit application. Normally, CDA Alloy 110 (99.90 percent minimum copper, 0.04 percent nominal oxygen) or CDA Alloy 102 (99.95 percent minimum copper) may be employed. Naturally, it is preferred that the copper sheet or foil be suitably cleaned before treatment.

The copper or copper alloy material is immersed in a phosphoric acid dichromate solution for at least 2 seconds. The acid normally employed is from about 8 percent to about 85 percent concentration of phosphoric acid of the formula $H_3PO_4$, although a solution of phosphates, such as acid solutions of, for example, sodium phosphate ($Na_2HPO_4$), potassium phosphate ($K_2HPO_4$), and lithium phosphate ($LiH_2PO_4$). Preferably, the concentration range of the phosphate solution corresponds to about 15 percent of phosphoric acid of the formula $H_3PO_4$ up to solubility limits in water.

The solution also contains from 3.5 grams per liter up to the solubility limit of sodium dichromate and/or potassium dichromate. Sodium dichromate has the formula $Na_2Cr_2O_7 \cdot 2H_2O$ and potassium dichromate has the formula $K_2Cr_2O_7$.

In accordance with the present invention, when the concentration of phosphoric acid is increased the minimum dichromate should be proportionately increased.

The use of the chromate in the phosphoric acid solution is important. It has been found experimentally that dichromate is necessary and in amounts at least proportional to the phosphate concentration, as shown in the aforesaid U.S. Pat. No. 3,716,427. No other oxidizing agent has been found to work satisfactorily. Yet, it is necessary to have the copper in an oxidized state, as shown by the successful formation of protective films when thermally oxidized copper is immersed in phosphoric acid and by the lack of success when unoxidized copper is immersed in phosphoric acid free of dichromate.

The temperature of acid solution is generally ambient for practical considerations, but may range from below that of room temperature up to substantially the boiling point. The aforementioned solution may also be suitably agitated, if desired, by conventional mechanical means. The maximum immersion time in the bath is not critical. The film formation is completed in two seconds. Further immersion does not destroy the properties of the film. As a practical test, copper foil coupons have been permitted to rest in the solution for 2 weeks, with no loss of protection and with no damage to the surface texture. The preferred immersion time range is for from 7 to 30 seconds, for convenience.

After immersion in the phosphoric acid - dichromate bath, the material is rinsed with water. Normally, a spray rinse with cold water is quite sufficient, although any desired convenient rinsing condition may be employed.

Following the rinsing step, the material is immersed in an aqueous solution for at least 2 seconds, and preferably at least 5 seconds, containing an alkali metal phosphate in a concentration of at least 18 percent by weight up to the solubility limit. The temperature of the bath should be at least 80° C and may range to the boiling point. Preferably, the bath is maintained at a temperature of from 90° C to the boiling point. The bath should be maintained at a pH in the range of 2 to 4, preferably by utilizing the required amount of phosphoric acid since phosphoric acid will not introduce any new material to the composition of the bath. Naturally, others may be employed.

To achieve the set conditions of pH and phosphate content, a variety of starting conditions are possible. Thus, the starting salts may be alkali metal phosphates of the mono-hydrogen, di-hydrogen or tribasic types.

This step is particularly important since it has been found to critically improve the bond strength of the laminate when the laminate is subjected to an accelerated aging test.

The treated material is then rinsed with water in the same manner as indicated hereinabove, that is, preferably spray rinsed with cold water. The treated material may now be dried and adhesively laminated to a plastic film, such as by employing a high temperature glue in order to form the laminate.

Alternatively, the process of the present invention advantageously contemplates variation in the process prior to lamination. For example, advantageously, the material after the rinse in phosphate solution may be immersed in another rinse, an aqueous solution maintained at a temperature of at least 90° C and a pH of at least 8.0 for at least 2 seconds, preferably at an akaline pH of from about 8.5 to 11.0 with the temperature of the water ranging to the boiling point.

Any suitable addition agent may be employed to adjust the pH here, but it is generally selected from the group consisting of the basic reaction salts of the alkali metals, the basic reaction salts of the alkaline earth metals, the hydroxides of the alkali metals, and the hydroxides of the alkaline earth metals. Ammonium salts with a basic reaction such as ammonium carbonate salts may also be readily employed. Calcium hydroxide is particularly preferred to adjust the pH to the range of 8.0 to 11.0. Ammonium hydroxide may also be readily employed when adjusting the pH towards the lower critical limit of about 8.0 if desired.

This rinse of the present invention converts the copper phosphate coating to a copper complex phosphate. The particular copper complex phosphate produced by the rinse is dependent upon and will contain the cation of the addition agent employed. Thus, for example, should calcium hydroxide be employed, the copper phosphate coating will be converted to a copper calcium phosphate which is glassy like and substantially pore free. Likewise, should sodium hydroxide be employed, the coating obtained is a glassy like and substantially pore free coating of copper sodium phosphate.

The resultant coating after this step is a glassy like and substantially pore free coating of the copper complex phosphate ranging in thickness of from 20 to 1,000 Angstrom units.

The copper or copper alloy is rinsed for at least 2 seconds and, although not critical, rinsing is not normally longer than about 2 minutes for practical considerations. Normally rinsing is by immersion in a rinse bath, although other methods such as spraying may also be readily employed. Suitable agitation in an immersion type rinse may also be provided, if desired.

If desired, the copper or copper alloy may first be given a preliminary rinse, such as a spray rinse, in cold or unheated water with the pH unadjusted in order to first remove the excess phosphating solution before rinsing at a pH of at least 8.0.

The upper pH limit is governed only by the saturation limit of the particular pH adjuster employed and is therefore not critical.

Following the rinsing, the copper or copper alloy is then dried such as by air blast, rinsing in an alcohol solution such as methanol and allowing to dry or merely by allowing to dry by exposure to the atmosphere.

Optionally, if desired, the treated copper may be subjected to an inert gas annealing operation. It is an advantage of the present invention that annealing can be readily tolerated without change in standard annealing procedures suitable for wrought copper foil. Preferred annealing conditions are from 200° to 400° C for at least 15 minutes, and preferably less than 4 hours.

Following rinsing and drying the treated surface of the copper sheet or foil may be adhesively laminated to a plastic film such as by employing a high temperature glue in order to form laminate.

The resultant laminate comprising copper sheet or foil and a plastic film is particularly useful in the manufacture of flexible printed circuitry. Although not critical the preferred plastic film comprises a polyester or a polyimide organic compound, and in particular Mylar and Kapton, respectively.

Preferably, but not necessarily, before the aforementioned laminating the copper foil or sheet, when in the hard condition, is recrystallized annealed in a reducing atmosphere.

A further embodiment of the present invention is the applying of a photoresist to the unbonded surface of the copper component of the aforementioned laminate and then conventionally impressing a pattern of the required circuitry which transforms the photoresist to an acid insoluble compound at the area of the impressed circuitry. The unwanted copper is then dissolved away by a suitable etchant such as acidic ferric chloride or ammonium persulfate, in those areas of the laminate wherein the photoresist has not been transformed into an acid insoluble compound during projection of the circuitry. The laminate is then rinsed and dried and thereby a completed flexible circuit is formed.

The copper provided in forming the flexible printed circuit of the present invention is normally from about 0.25 to 6 mils in thickness and may be any suitable copper or alloy thereof which is capable of carrying the required current for the intended application.

The circuit laminate of the present invention is thus characterized by having high bond strength as a result of the aforementioned treatment, as well as substantially no acid undercutting of the circuitry at the bonded interface, i.e., at each side of the circuitry where the circuitry is adhesively laminated to the plastic film. The high bond strength and acid undercutting resistance are not degraded by long time exposure to the atmosphere.

The circuit as well as the laminate and copper or copper alloy, of the present invention is further characterized by having uniformly thereon a glassy like, and pore free copper complex phosphate coating of a thickness of from about 20 to 1,000 Angstrom units and readily overcomes the aforementioned disadvantages of high acid undercutting and of low bond strength as well as other disadvantages of the prior art.

For example, in the manufacture of flexible printed circuits electrodeposited copper foil is frequently employed in place of wrought annealed copper wherein one side, or surface, of the foil is relatively rough. The rough surface is oxidized and then both sides of the electrodeposited copper foil are treated with the aforementioned benzotriazole inhibitor. The inhibitor forms a copper salt when it reacts with the copper oxide present on both sides of the foil, intentionally on the rough side and as a residual on the other or smooth side. This residual benzotriazole salt on the smooth side causes uneven etching response of the copper foil plastic laminate.

Electrodeposited copper is also disadvantageous when bonded to a polyester film since the foil is generally of low ductility whereas a relatively high ductile material, such as rolled and annealed copper, is desirable in flexible printed circuitry wherein a polyester film, such as Mylar, or a polyimide film, such as Kapton, is employed.

Furthermore, electrodeposited copper does not tend to uniformly etch away in the unwanted areas of the copper component during formation of the circuitry due to its relatively large grain size; whereas, the more uniform and fine grain size of rolled and annealed copper tends to provide for more even etching which is preferred in the forming of high quality circuitry.

Electrodeposited copper inhibited by benzotriazole is also disadvantageous when bonding to a polyimide plastic film since the adhesives used with polyimide films, such as Kapton, require a curing temperature which is sufficiently high to promote degradation of the copper benzotriazole salt thereby degrading or destroying the laminate. Therefore rolled copper foil is used with the polyimides rather than electrodeposited copper.

It is also noted that the flexible circuit of the present invention may readily be soft soldered over the aforementioned film thus providing for increased economy in assembling of composite electrical circuitry.

It is also a feature of this treatment that with some glues, notably the polyesters, the presence of the coating on the copper in a copper-glue-Mylar laminate prevents migration of the copper into the glue. This migration is damaging since not only is the discoloration unsightly but it is accompanied by a loss of bond strength. The effect occurs during bonding operations at elevated temperatures and during long storage at room temperature and is brought out particularly by accelerated aging tests at elevated temperatures.

One should not allow the phosphate solution having a concentration of at least 18 percent to stand for extended periods of time, such as for several days, since the solution tends to degrade on standing. Some materials, however, such as sodium hexametaphosphate, have been found to have effective shelf lives on the order of weeks.

It is further noted that as a result of the aforementioned treatments that copper and its alloys have very high tarnish resistance and therefore long shelf life prior to laminating as well as prolonged aesthetic value since the normal corrosion products produced in both clean and polluted atmospheres are reduced.

In addition the method of the present invention of forming a tarnish resistant film on copper and alloys has also been surprisingly found to prevent sticking together of the metal sheets during annealing, which thus overcomes a prevalent problem during mill processing.

The present invention will become more readily apparent from the following illustrative examples.

In the examples that follow, the thermal degradation test is carried out in the following manner. Treated copper is bonded to Mylar film (5/1,000 inch thick) with a polyester glue containing an isocyonate catalyst. In the bonding process, the glue is spread on the copper with a draw rod close-wound with No. 28 nichrome wire; the copper and plastic are pressed together by passage through a heated roll-nip and are then held under a few pounds pressure at room temperature for three days to allow the plastic to "cure." The laminate is then masked in a pattern of fine parallel lines each 16/1,000 inch wide and 4 inches long. Etching with ferric chloride solution at a concentration of 57 gms. $FeCl_2$ to 100 mls water and a temperature about 40° C is carried out to give a resultant pattern of fine copper lines on plastic. Plastic coupons, each bearing four copper lines, are cut from the sheet and placed in an oven controlled at 150° C for periods of time up to 24 hours. The bond strength between copper and adhesive is measured by fixing the coupons to a freely rotating wheel (diameter 6 inches) with double-sided tape and slowly peeling the copper strips perpendicularly from the plastic one by one with a delicate spring balance fixed to the end of the strip.

The resulting data of force versus time will show if the bond is being degraded by the thermal aging. The test is used by some circuit makers to screen incoming copper-plastic laminates. Typical specifications are that the final bond must not fall below 50 gms (for a 20/1,000 inch wide copper strip) and must not depart more than 50 percent in either direction from its value at zero time of aging.

EXAMPLE I

Cold-rolled unannealed copper foil of CDA copper alloy 110, 0.0014 inches thick, was immersed for 10 seconds in a bath of 35 percent by weight phosphoric acid (reagent grade) and 35 grams per liter potassium dichromate dihydrate. After a rinse in water at room temperature it was dried and then bonded to Mylar film with a polyester glue. The laminate was subjected to the thermal aging test described above with the following results.

TABLE I

| Time (hours) | 0 | 2 | 4 | 16 | 24 |
|---|---|---|---|---|---|
| Bond (gms.) | 55 | 100 | 37 | 25 | 23 |

In this set of results the initial bond would be satisfactory for many applications but the progress of aging leads to very poor bonds, not acceptable by most users.

EXAMPLE II

Cold-rolled unannealed copper foil of CDA copper alloy 110, 0.0014 inches thick, was given a two-fold treatment:

a. immersion for 10 seconds in a bath of 35 percent by weight phosphoric acid (reagent grade) and 35 grams per liter potassium dichromate dihydrate, followed by a rinse in water at room temperature and (*b*) immersion for 10 seconds in a bath of water at the boiling point whose pH had been adjusted to 10.0 with a slurry of calcium hydroxide in water, followed by a rinse in water at room temperature and by drying. After this sample of copper had been bonded to Mylar film with a polyester glue, the laminate was subjected to the thermal aging test described above with the following results:

TABLE II

| Time (hours) | 0 | 2 | 4 | 16 | 24 |
|---|---|---|---|---|---|
| Bond (gms) | 60 | 80 | 62 | 80 | 65 |

The result indicates a satisfactory bond strength with time.

EXAMPLE III

Cold-rolled unannealed copper foil, of CDA copper alloy 110, 0.0014 inches thick, was given a three-fold treatment:

a. immersion for 10 seconds in a bath of 35 percent by weight phosphoric acid (reagent grade) and 35 grams per liter potassium dichromate dihydrate, followed by a rinse in water at room temperature, and
b. immersion for 10 seconds in a bath of sodium hexa meta phosphate, 250 gms per liter of distilled water, the solution being at the boiling point and the pH being adjusted to 3.5 with reagent grade phosphoric acid, and
c. immersion for 10 seconds in a bath of water at the boiling point whose pH had been adjusted to 10.0 with a slurry of calcium hydroxide in water, following by a rinse in water at room temperature and by drying. After this sample of copper had been bonded to Mylar film with a polyester glue, the laminate was subjected to the thermal aging test described above with the following results:

TABLE III

| Time (hours) | 0 | 2 | 4 | 16 | 24 |
|---|---|---|---|---|---|
| Bond (gms) | 90 | 98 | 95 | 98 | 93 |

In this test the bond strength was improved initially and stayed at this improved very high level to the full time of the test.

This invention may be embodied in other forms or carried out in other ways without departing from the spirit or essential characteristics thereof. The present embodiment is therefore to be considered as in all respects illustrative and not restrictive, the scope of the invention being indicated by the appended claims, and all changes which come within the meaning and range of equivalency are intended to be embraced therein.

What is claimed is:

1. A method for producing a tarnish resistant film on copper and copper alloys comprising:

A. providing a material selected from the group consisting of copper and copper alloys;
B. applying to said material a phosphoric acid solution of at least 8 percent concentration and containing from 3.5 grams per liter up to the solubility limit of a material selected from the group consisting of sodium dichromate and potassium dichromate and mixtures thereof, for at least 2 seconds;
C. rinsing said material in water;
D. immersing said material for at least 2 seconds in an aqueous solution containing an alkali metal phosphate in a concentration of at least 18 percent by weight, said solution being maintained at a temperature of at least 80° C and at a pH in the range of 2 to 4; and
E. finally rinsing said material in water.

2. A method according to claim 1 wherein the treatment time in Step D. is for at least 5 seconds.

3. A method according to claim 1 wherein said alkali metal phosphate in step D. is utilized in a concentration of at least 18 percent by weight to solubility.

4. A method according to claim 1 wherein said solution in step D. is maintained at a temperature of from 90° C to the boiling point.

5. A method according to claim 1 wherein said solution in step D. is maintained at a pH in the range of 2 to 4 by the addition of phosphoric acid.

6. A method according to claim 1 wherein said rinsing step E. is for at least 2 seconds in water maintained at a pH of at least 8.0 and at a temperature from about 90° C up to the boiling point.

7. A method according to claim 6 wherein said water is adjusted to a pH of at least 8.0 with a compound selected from the group consisting of the basic reaction salts of the alkali metals, the basic reaction salts of the alkaline earth metals, the hydroxides of the alkali metals, the hydroxides of the alkaline earth metals, ammonium salts with a basic reaction, ammonium hydroxide and mixtures thereof.

8. A method according to claim 6 wherein the pH is adjusted to the range of 8.0 to 11.0 with calcium hydroxide.

9. A method according to claim 6 wherein said material is first rinsed in water prior to said rinsing step for at least 2 seconds at a pH of at least 8.0.

10. A method according to claim 1 wherein said copper is copper sheet or foil.

11. A method according to claim 1 wherein in step B. when the concentration of phosphoric acid is increased, the minimum dichromate is proportionately increased.

12. A method according to claim 1 wherein the immersion time in step B. is from 7 to 30 seconds.

13. A method according to claim 1 wherein the phosphate in step D. is sodium hexametaphosphate.

14. A method of producing a flexible laminate comprising:

A. providing a material selected from the group consisting of copper and copper alloys;

B. applying to said material a phosphoric acid solution of at least 8 percent concentration and containing from 3.5 grams per liter up to the solubility limit of a material selected from the group consisting of sodium dichromate and potassium dichromate and mixtures thereof, for at least 2 seconds;

C. rinsing said material in water;

D. immersing said material for at least 2 seconds in an aqueous solution containing an alkali metal phosphate in a concentration of at least 18 percent by weight, said solution being maintained at a temperature of at least 80° C and at a pH in the range of 2 to 4;

E. finally rinsing said material in water;

F. drying said material; and

G. adhesively laminating a plastic film to said surface.

15. A method of producing a flexible printed circuit comprising:

A. providing a material selected from the group consisting of copper and copper alloys;

B. applying to said material a phosphoric acid solution of at least 8 percent concentration and containing from 3.5 grams per liter up to the solubility limit of a material selected from the group consisting of sodium dichromate and potassium dichromate and mixtures thereof, for at least 2 seconds;

C. rinsing said material in water;

D. immersing said material for at least 2 seconds in an aqueous solution containing an alkali metal phosphate in a concentration of at least 18 percent by weight, said solution being maintained at a temperature of at least 80° C and at a pH in the range of 2 to 4, E. finally rinsing said material in water;

F. drying said material;

G. adhesively laminating a plastic film to said surface;

H. applying a photoresist to the opposing surface of said material;

I. projecting a circuitry pattern upon said photoresist wherein said photoresist is transformed into an acid insoluble compound at said circuitry pattern;

J. dissolving away the unwanted portion of said material from said circuitry pattern by an acid solution;

K. rinsing said surface; and

L. drying said surface, thereby forming a flexible printed circuit.

* * * * *